(12) United States Patent
Strasser et al.

(10) Patent No.: US 11,816,410 B2
(45) Date of Patent: Nov. 14, 2023

(54) SYSTEM AND METHOD FOR FORMAL FAULT PROPAGATION ANALYSIS

(71) Applicant: SIEMENS ELECTRONIC DESIGN AUTOMATION GMBH, Munich (DE)

(72) Inventors: Dominik Strasser, Munich (DE); Jörg Grosse, Munich (DE); Jan Lanik, Munich (DE); Raik Brinkmann, Munich (DE)

(73) Assignee: Siemens Electronic Design Automation Gmbh, Munich (DE)

( * ) Notice: Subject to any disclaimer, the term of this patent is extended or adjusted under 35 U.S.C. 154(b) by 0 days.

(21) Appl. No.: 17/899,210

(22) Filed: Aug. 30, 2022

(65) Prior Publication Data

US 2022/0414306 A1 Dec. 29, 2022

Related U.S. Application Data

(63) Continuation of application No. 16/620,622, filed as application No. PCT/EP2018/066315 on Jun. 19, (Continued)

(30) Foreign Application Priority Data

Jun. 19, 2017 (LU) .................................. 100321

(51) Int. Cl.
*G06F 30/3323* (2020.01)
*G01R 31/3183* (2006.01)
(Continued)

(52) U.S. Cl.
CPC ..... *G06F 30/3323* (2020.01); *G01R 31/2839* (2013.01); *G01R 31/2844* (2013.01);
(Continued)

(58) Field of Classification Search
CPC ............. G06F 30/3323; G06F 9/30098; G01R 31/2839; G01R 31/2844; G01R 31/318307; G01R 31/318314; G01R 31/31835
See application file for complete search history.

(56) References Cited

U.S. PATENT DOCUMENTS 5,640,403 A * 6/1997 Ishiyama ....... G01R 31/318342
703/15
6,134,516 A 10/2000 Wang et al.
(Continued)

FOREIGN PATENT DOCUMENTS

JP H07306881 A 11/1995
JP H1166114 A 3/1999
(Continued)

OTHER PUBLICATIONS

Z. Liu, S. K. Chaganti and D. Chen, "Toward complete analog fault coverage with minimal observation points using a fault propagation graph," 2016 IEEE International Symposium on Circuits and Systems (ISCAS), Montreal, QC, Canada, 2016, pp. 1282-1285. (Year: 2016).*

(Continued)

Primary Examiner — Cynthia Britt
(74) Attorney, Agent, or Firm — Lempia Summerfield Katz LLC

(57) ABSTRACT

A system and method are disclosed for formulating a sequential equivalency problem for fault (non)propagation with minimal circuit logic duplication by leveraging information about the location and nature of a fault. The system and method further apply formal checking to safety diagnoses and efficiently models simple and complex transient faults.

12 Claims, 13 Drawing Sheets

Related U.S. Application Data 2018, now Pat. No. 11,520,963, which is a continuation-in-part of application No. 15/626,674, filed on Jun. 19, 2017, now abandoned.

(51) Int. Cl.
  *G01R 31/28* (2006.01)
  *G06F 9/30* (2018.01)

(52) U.S. Cl.
  CPC .......... *G01R 31/31835* (2013.01); *G01R 31/318307* (2013.01); *G01R 31/318314* (2013.01); *G06F 9/30098* (2013.01)

(56) References Cited

U.S. PATENT DOCUMENTS

| | | |
|---|---|---|
| 6,188,934 B1 | 2/2001 | Emura |
| 6,301,685 B1 | 10/2001 | Shigeta |
| 6,385,750 B1 | 5/2002 | Kapur et al. |
| 7,926,021 B2 | 4/2011 | Blome et al. |
| 8,630,824 B1 | 1/2014 | Ip et al. |
| 8,683,400 B1 | 3/2014 | O'riordan et al. |
| 9,739,827 B1 | 8/2017 | Spinner et al. |
| 2003/0149916 A1 | 8/2003 | Ohtake et al. |
| 2007/0050740 A1 | 3/2007 | Jacobi et al. |
| 2007/0245197 A1 | 10/2007 | Hiraide |
| 2008/0256404 A1 | 10/2008 | Funatsu |
| 2009/0049331 A1 | 2/2009 | Blome et al. |
| 2010/0023824 A1 | 1/2010 | Buckley, Jr. |
| 2016/0267216 A1 | 9/2016 | Goel et al. |
| 2016/0283628 A1 | 9/2016 | Peixoto et al. |
| 2018/0149696 A1 | 5/2018 | Erickson et al. |

FOREIGN PATENT DOCUMENTS

| | | |
|---|---|---|
| JP | H11153646 A | 6/1999 |
| JP | 2007293589 A | 11/2007 |

OTHER PUBLICATIONS

S. Zhang, K. R. Pattipati, Z. Hu, X. Wen and C. Sankavaram, "Dynamic Coupled Fault Diagnosis With Propagation and Observation Delays," in IEEE Transactions on Systems, Man, and Cybernetics: Systems, vol. 43, No. 6, pp. 1424-1439, Nov. 2013. (Year: 2013).*

A. Riefert, J. Muller, M. Sauer, W. Burgard and B. Becker, "Identification of critical variables using an FPGA-based fault injection framework," 2013 IEEE 31st VLSI Test Symposium (VTS), Berkeley, CA, USA, 2013, pp. 1-6. (Year: 2013).

Benso, Alfredo, Alberto Bosio, Stefano Di Carlo, and Riccardo Mariani. "A functional verification based fault injection environment." In 22nd IEEE International Symposium on Defect and Fault-Tolerance in VLSI Systems (DFT 2007), pp. 114-122. IEEE, 2007.

Bonfiglio, Valentina, Leonardo Montecchi, Ivano Irrera, Francesco Rossi, Paolo Lollini, and Andrea Bondavalli. "Software faults emulation at model-level: Towards automated software fmea." In 2015 IEEE International Conference on Dependable Systems and Networks Workshops, pp. 133-140. IEEE, 2015.

Caty, Olivier, Peter Dahlgren, and Ismet Bayraktaroglu. "Microprocessor silicon debug based on failure propagation tracing." IEEE International Conference on Test, 2005 . . . IEEE, 2005. pp. 284-293.

Darbari, Ashish, et al. "A new approach for transient fault injection using symbolic simulation." 2008 14th IEEE International On-Line Testing Symposium. IEEE, 2008.

Nguyen, Huy, and Michael S. Hsiao. "Sequential equivalence checking of hard instances with targeted inductive invariants and efficient filtering strategies." In 2012 IEEE International High Level Design Validation and Test Workshop (HLDVT), pp. 1-8. IEEE, 2012 . . . .

Smith, Doug. "How Formal Reduces Fault Analysis for ISO 26262." Mentor Graphic white paper (2017).

Ziade, Haissam, Rafic A. Ayoubi, and Raoul Velazco. "A survey on fault injection techniques." Int. Arab J. Inf. Technol. 1.2 (2004).

* cited by examiner

SYSTEM AND METHOD FOR FORMAL FAULT PROPAGATION ANALYSIS

The present patent document is a continuation of U.S. patent application Ser. No. 16/620,622, filed Dec. 9, 2019, which is a § 371 nationalization of PCT Application Serial No. PCT/EP2018/066315, filed Jun. 19, 2018, designating the United States, which is a continuation-in-part of U.S. patent application Ser. No. 15/626,674, filed Jun. 19, 2017. This patent document also claims the benefit of Luxembourg Patent Application No. 100321, filed Jun. 19, 2017. The aforementioned patent applications are hereby incorporated by reference in their entireties.

TECHNICAL FIELD

The present disclosure relates to equivalence checking as a tool to verify fault propagation or non-propagation in sequential circuits.

BACKGROUND

Many industries, such as the automotive industry, have incorporated sophisticated electronics into their products and services. Welcome though these advances are, it is critical to understand that the electronic systems enabling these features also present countless new opportunities for things to go wrong if they are not adequately verified. A defective headrest video screen may be an irritation to a young passenger in the back seat, but a malfunctioning corrective steering system may cost the occupants of the vehicle their lives. These risks have caused industries to adopt stringent safety-related standards for electrical or electronic systems.

For example, the ISO 26262 standard governs the development of safety-related electrical and/or electronic (E/E) systems within road vehicles. ISO 26262 imposes stringent requirements that encompass the entire life cycle of a system, from concept phase to development, production, and decommissioning. It addresses the overall safety management process and covers relations with suppliers and interfaces for distributed development. The risk of liability is a clear driver of the adoption of the ISO 26262 standard, but there is more at stake: vehicle recalls in the millions and malfunctions leading to fatal car accidents not only cause economic damage, but also diminish the brand image of the companies involved. The standard specifies two types of component faults, which must be fully verified, as systematic faults and random faults.

Systematic faults are introduced during component development, either through human error or tool/methodology malfunction. Systematic faults may be handled through rigorous verification and the careful tracking of specific device requirements. Random faults occur during the actual operation of the device due to external effects. These faults must be safely handled by the circuitry within the device. This requires the use of fault handling capabilities built into the systems, which must in turn be verified to provide that they will catch the vast majority of possible random faults.

Over the past several years, automotive suppliers have made substantial investments to meet ISO 26262 requirements, which may lead to significant increases in development costs. Maturing the application of the standard and moving towards systematic and automated development methods is critical to achieve and sustain success.

Thanks to ease-of-use and capacity advances, formal-based verification methodologies have achieved recent wide adoption in the industry. Formal verification is widely recognized as a powerful technique to uncover hardware design bugs that might otherwise escape simulation-based verification and lead to systematic failures. A key characteristic of formal tools is the ability to examine design behavior exhaustively, without the need for input stimuli, and prove that the design never deviates from its intended function, as specified by a property or assertion. Even for simple designs, simulation tools cannot achieve this level of precision. Formal tools have multiple applications for both systematic and random fault verification.

Failures happen when an element of a system no longer performs its required function. They are caused by errors, such as a hardware component not behaving as expected. Errors are caused by faults either in the design of the device or occurring during its operation. Examples of such errors in an automotive environment and possible causes are shown in FIG. 1.

A fault is an incorrect logical value that appears on some logical element in an electronic design ("design under test" or "DUT") either momentarily (e.g., due to being hit by a high-energetic particle) or permanently (e.g., due to material decay or permanent damage to the circuitry). Such faults may potentially alter the behavior of the electronic system. These faults, in safety critical systems, may lead to death, injury, or high economical losses.

For this reason, safety critical system designers need to implement measures that detect and/or fix incorrect behaviors introduced by random faults using techniques such as redundant logic circuits, error correcting codes and similar. ISO 26262 defines two categories of failures: systematic and random.

Systematic failures may originate in both hardware and software and have a deterministic relation to certain causes or faults, for example, specification or coding mistakes in software or hardware code. These faults affect all manufactured components and must be avoided. Random failures originate only in hardware and occur in an unpredictable fashion that may follow a probability distribution. They cannot be traced back to specific problems and are expected to occur during system operation. A good example is radiation corrupting a DRAM memory during device operation. Note that random component failure might be seen as a systematic fault at the vehicle level.

ISO 26262 prescribes the use of safety measures to avoid systematic faults and safeguard against random hardware faults. Formal tools may play a significant role in implementing safety measures efficiently, and indeed are central in many safety-critical development flows.

Safety mechanisms are a class of safety measures built into the device, intended to detect faults or control failures, as shown in FIG. 2A. ISO 26262 may require the use of safety mechanisms to detect, and possibly correct, the effects of some random hardware faults. Safety mechanisms are implemented in both software and hardware, and their ultimate goal is to reduce the occurrence of random failures that may lead to violations of safety goals.

Software-based mechanisms include routines that run periodically to detect hardware errors, mostly caused by permanent faults or latent transient faults. Another example is redundant software performing the same operation multiple times and comparing results. One of the challenges is to detect as many faults as possible, while limiting the size and run time of the code.

Redundancy is the foundation of many hardware-based safety mechanisms.

Common techniques include having a processor core running in lockstep with a duplicate core and comparing results; duplication or even triplication of critical modules or configuration registers with the addition of majority-voting logic (e.g., triple modular redundancy); failsafe encoders and decoders to protect memories or bus transactions (EDC/ECC); detecting and correcting single-bit errors; and detecting double bit errors.

Hardware-based safety mechanisms significantly complicate all stages of development, including physical implementation, as they increase circuit area and make it harder to achieve the target clock frequency.

The development of hardware safety mechanisms must follow a rigorous process to avoid systematic faults. The functional verification of the RTL model implementing a safety mechanism is a critical activity, as mistakes may lead to hardware that causes dangerous situations rather than preventing them.

Rigorous development processes are key to reducing the risk of systematic faults in a system, introduced through human error. Advanced hardware development flows employ many tools and methods to detect issues as early as possible, plan verification activities, and track progress. ISO 26262-8 clause 6, however, demands an accurate tracing of requirements throughout the relevant development acts. The ultimate goal is to provide that a product satisfies its safety requirements. This involves tracking a large number of bidirectional, many-to-many relationships, mapping requirements through design features to verification plan elements, and finally, to feedback test coverage data to all these documents.

For the functional verification of Register Transfer Language (RTL) models, engineers apply a variety of techniques, including directed and random coverage-driven simulation tests. Structural and functional coverage metrics are used to track progress and highlight gaps in the verification plan or specification documents.

Simulation-based verification environments may rely on centralized checks and thus suffer from low design observability. Even when a test activates a design feature that is not correctly implemented, the erroneous behavior may go undetected unless it propagates to an observation point (or checker). ISO 26262 specifies that requirements must be individually tested, and this testing process carefully tracked, as shown in FIG. 4. For simulation, this may involve creating individual, directed tests, which may be laborious and error-prone.

Assertion-based verification (ABV) is a well-established technique that addresses this issue. Assertions are flexible and may concisely express the expected design behavior at both low and abstract levels. They are distributed and always-on checkers that—crucially, in this context—may map more directly to requirements. Another key benefit of ABV is that formal tools may leverage assertions and examine them under all relevant stimuli scenarios. Moreover, with adequate tools and methodology, it is also possible to construct a set of non-overlapping assertions capturing all design requirements. Assertions, specifically end-to-end properties, may be easier to map to requirements through the implementation and verification plan. By leveraging ABV, the entire verification tracking mechanism is simplified through direct correlations between requirements and tests.

ISO 26262-5 addresses all hardware-specific development activities, and their requirements include a quantitative analysis of the effectiveness of safety mechanisms. Faults are classified according to the categories safe, single point, residual and multipoint. Safe faults are faults that are not in the safety relevant parts of the logic or are in the safety relevant logic but are unable to impact the design function, e.g., they cannot violate a safety goal. Single point faults are dangerous because they may violate a safety goal and there is no safety mechanism to protect against them. Residual faults also are dangerous because they may violate a safety goal and escape the safety mechanism. Multipoint faults may violate a safety goal but are observed by a safety mechanism. The multipoint faults may be subclassified as "detected," "perceived," and "latent."

Within the present context, multipoint faults and safe faults are not dangerous. However, identifying them is challenging. Safety-critical hardware may include a variety of safety mechanisms, and engineers must analyze the effects of several fault types on millions of potential fault locations interconnected by complex logic.

It is not trivial to confidently mark a fault as safe. Without adequate tools, only experts with intimate knowledge of the hardware may reach this conclusion. Similarly, expert engineering effort might be required to develop simulation workloads that may demonstrate the ability of a safety mechanism to observe a fault. Hardware teams for ASIL C or ASIL D applications have to demonstrate that only an extremely low proportion of dangerous faults may have an operational effect on their designs. Consequently, the ability to identify safe and multipoint faults automatically is critical to achieve this goal efficiently.

Fault injection is an established technique used to understand the effects of faults on fault-tolerant systems. ISO 26262 highly recommends the use of fault injection during the development of safety-critical hardware. To take into account operating conditions and full system interactions, fault injection may be performed on a system prototype. For example, instruments may be used to create heavy ion radiation, electromagnetic interference, power supply disturbances, or software issues that corrupt the content of memories or architecturally visible registers. Haissam Ziade, Rafic Ayoubi, and Raoul Velazco, "A Survey on Fault Injection Techniques. The International Arab Journal of Information Technology," Vol. 1, No. 2, July 2004. However, this method is challenging in terms of cost, controllability and observability of the system, and development schedule. Model-based fault injection may be performed early in the development flow and provides finer control over the system without being invasive: that is, the fault injection mechanism has no effect on the system other than the faults it injects. Ashish Darbari, Bashir Al Hashimi, Peter Harrod and Daryl Bradley, "A New Approach for Transient Fault Injection using Symbolic Simulation," 14th IEEE International On-Line Testing Symposium 2008.

The safety analysis of complex automotive SoCs including a variety of safety mechanisms poses many challenges. Precisely identifying the safety-critical implementation logic is no small matter. The number of fault locations to consider may be on the order of millions. Several types of permanent and transient faults may be injected in a fault location, and the effect of a number of simultaneous faults might have to be analyzed under different workloads. The number of relevant fault scenarios is huge.

In recent years, there has been progress in the availability of tools to perform fault injection on hardware models. While existing simulators may perform clumsy fault injection by using generic interface commands, the re-emergence of fault simulators, previously designed for the qualification of manufacturing tests, has brought substantial benefit to engineers in terms of enabling precise metrics and debug.

Fault propagation analysis is used to classify faults and derive diagnostic or detection coverage metrics. This task may be performed on RTL models but, according to ISO 26262 stipulations, will ultimately have to be performed on a model that is as close as possible to the actual hardware and that may provide good correlation not only at the logical level, but also on physical parameters, such as circuit area. This requires running the analysis on gate-level netlists.

Fault simulation is a standard approach to determine fault metrics. Fault simulators inject faults and analyze their propagation under user-defined input stimuli. Faults causing errors that are detected by a safety mechanism contribute to achieving the desired detection ratio. Faults not activated or propagated by the input stimuli consume a large proportion of the simulation cycles, while remaining in the "potentially propagatable" group. These faults are difficult to debug when considering stimulus improvements. In fact, a significant portion of them may be safe or "non-propagatable." Safe faults may never lead to a malfunction of the system, regardless of its state. Engineers may use "expert judgment" arguments to mark some faults as safe, thus increasing diagnostic or detection coverage.

Even modern fault simulators, however, have inherent shortcomings. The analysis of faults is inefficient with respect to both the fault scenarios (some simulators requiring one run per scenario) and the specific workload, or input vectors, applied to the model (simulators only execute one workload at a time). Moreover, to achieve the target ASIL diagnostic or detection coverage—the metric specifying the number of safe faults—engineers may have to manually identify safe faults, create complex tests that may activate and propagate tricky faults to safety logic, and define the boundaries of safety-critical logic. These tasks are effort-intensive, error-prone, and intrinsically incomplete.

Formal verification is widely recognized as a powerful technique to uncover hardware design bugs that might otherwise escape simulation-based verification and lead to systematic failures. A key characteristic of formal tools is the ability to examine design behavior exhaustively, without the need for input stimuli, and prove that the design never deviates from its intended function, as specified by a property or assertion. Even for simple designs, simulation tools cannot achieve this level of precision. Formal tools have multiple applications for both systematic and random fault verification.

"Formal methods" refers to mathematically rigorous techniques and tools for the specification, design, and verification of software and hardware systems. While formal property-checking tools have been available for decades, in the last ten years, thanks to advances in ease-of-use and capacity, formal-based methodologies have achieved wide adoption in the semiconductor industry. Formal verification is widely recognized as a powerful technique to uncover hardware design bugs that might otherwise escape simulation-based verification and lead to systematic failures.

A key characteristic of formal tools is the ability to examine design behavior exhaustively, without the need for input stimuli, and prove that the design never deviates from its intended function, as specified by a property or assertion. Even for simple designs, simulation tools cannot achieve this level of precision. A range of hardware development tasks has been improved through the use of appropriate formal-based solutions (or apps). These range from RTL design exploration and formal linting to the end-to-end verification of critical modules.

Another key characteristic of formal tools, particularly relevant to safety-critical applications, is the ability to finely control the injection of faults into hardware models and analyze their sequential effects. Crucially, formal tools have the potential to perform this task very efficiently, in terms of both user effort and computational demands, and non-invasively (no need for code instrumentation steps).

As part of the safety verification process, it may be necessary to understand how faults propagate through an integrated circuit. Examples of prior systems and methods for waveform or propagation analysis are disclosed in U.S. Pat. No. 8,630,824 and U.S. Patent Application Publication No. 2016/0283628.

Conventional fault propagation systems and methods may display a golden design and the faulty design next to one another, showing the value of signals in the golden design versus the design with the fault injected. Such conventional environments might be able to list all internal signals where the values are different between the golden design and the faulty design, but they may display signals which are different, including signals that are irrelevant to the fault debug.

To provide that all reasonably expectable random faults and their combinations are handled by the system and that no such faults may induce erroneous behavior of the system, verification engineers may perform an extensive testing of various scenarios in which faults are injected at different locations of the DUT with the goal of determining whether the behavior of the DUT at some critical observation points (e.g., primary outputs) may be altered and/or whether such alteration may be detected. The information about what portion of potential faults may be detected or automatically corrected is necessary for safety certifications that are required by regulatory authorities in certain fields (e.g., ISO26262 in automotive domain).

Traditionally, analysis of fault propagation and observability is done by simulation of many potential faults under a variety of input patterns. However, simulation of all possible situations may not be practically possible. Therefore, it is advantageous to use formal verification techniques, which give mathematically irrefutable proofs that a fault does not propagate or is observed. In many cases formal checking may be even faster than traditional techniques based on simulation.

Formal fault propagation analysis may be done by using equivalency checking, which is a formal method to assess a behavioral equivalency between two circuits. In this case one circuit (golden) will be the original DUT and the other circuit (revised) will be the DUT with a fault scenario modeling a random fault, like stuck at and single event faults (fault) injected at some specific location. This means the size of the circuit provided to the equivalency checker is double of the original circuit (or of the part that needs to be considered).

Use of formal equivalence checking as a tool to verify fault (non)propagation in sequential circuits is disclosed in D. Smith, "How Formal Reduces Fault Analysis for ISO 26262."

Observable behavior of a DUT is defined by a set of observation points. Assuming that one knows the exact place where a fault is going to occur, the objective is to prove either:
  1. That the fault has no effect on the DUT values at the observation points (in this case we say the fault is not propagated (PA)); or 2. Find a trace that leads to a different behavior at some observation point, in particular at least one observation point, due to the fault (in this instance we say the fault is propagated (PA)).

Furthermore, the design may have capability to detect and signal that an error has happened within, leaving the recovery actions to the rest of the system or to the user.

This, in effect, introduces additional classification of propagatable faults (PAs). The PAs that have been detected are considered safe faults, while the propagatable faults that are not detected are considered dangerous faults.

TABLE 1

Fault diagnostic

| Type of Fault | Detected | Not Detected |
|---|---|---|
| Non-propagatable | Safe (Detection over-pessimistic) | Safe |
| Propagatable | Safe (Detected) | Dangerous (Not Detected) |

The decision problem of whether a fault is PA/NPA is referred to herein as a fault propagation, the problem whether a fault is detected by the design is referred as fault detection, and the problem of whether it is safe or not is referred to as a fault diagnosis.

Observation Points and Outputs

The observable behavior of a digital design may be defined by value-traces that may be generated on the outputs of the design, provided that its inputs are stimulated by value-traces that conform to input constraints. However, sometimes we may be interested in values of signals that are internal to the design. Also, we may choose to ignore potential propagation to some unimportant signals. Hence instead of the outputs, we will be interested in potential fault propagation into a set of arbitrary defined signals—the observation points. From the mathematical point of view, there is no real difference between outputs and observation points, as the internal observation points may be simply labeled as outputs and the output signals that are not observed may be removed from the output set. For this reason, the terms outputs and observation points are used interchangeably.

Implementation

Implementation of formal fault propagation/detection may be performed through sequential equivalence check. The present disclosure provides improvements that make the problem easier for the formal tool, leading to a significantly more efficient procedure.

The approach may be to inject the fault into the original design and then compare this newly created design with the original, trying to find out a set of input patterns, that applied to both designs lead to different behavior on the outputs. This is done through forming a combined circuit 100 as shown in FIG. 2B, which is known as a sequential check. In this new circuit 100, the same set of inputs 110 is routed to both the original design 120 and faulty design 130. The outputs of both designs 120, 130 are than compared one-by-one with a comparator circuit 140 having comparators 142, 144, . . . 146, and if any of the pairs differ, the output of the comparator circuit 1400 is set to 1 (FIG. 2C.) If both the circuits behave the same, the output will be 0. The sequential equivalence checker uses formal methods in order to prove beyond all doubt that the output is 0 and hence the output behavior of the faulty circuit 130 is the same as of the original circuit 120 under all possible inputs (NPA). On the other hand, if there is such an input pattern that leads to different behavior of faulty circuit 130, then the output of the comparator circuit 1400 will eventually become 1, and the formal tool will display the exact input pattern under which this happens, omitting the need for any simulation.

SUMMARY

In an embodiment, the present disclosure provides an improvement to prior approaches by applying a more compact encoding of the equivalency problem. The present disclosure also provides richer fault modelling capable of describing more complex faults. The present disclosure also extends the application of formal methods from simple fault propagation to fault detection (diagnostic).

In another embodiment, a method is provided to minimize the circuit logic duplication needed to formulate the sequential equivalency problem for fault (non)propagation by leveraging the information we have about the location and nature of the fault. The present disclosure also applies formal check to safety diagnoses and efficiently models simple and complex transient faults.

In an embodiment, a system and a computer-implemented method are provided for performing a sequential equivalency check for analysis of fault propagation includes injecting a fault; identifying, among a plurality of registers, a first set of registers in which the injected fault cannot propagate and a second set of registers in which the injected fault may propagate. For each register of the plurality of registers, the identification includes running an update function and assigning the register to the second set of registers if the register changes as a result of the update function and assigning the register to the first set if the register does not change as a result of the update function. The method includes duplicating the second set of registers to derive a reduced stated duplication for performing equivalence checking.

In an embodiment, identifying the first set and the second set includes a combinatorial check, wherein for each register checking the update function.

In another embodiment, the identifying includes a sequential check, in one clock cycle.

The acts may be iterative and repeated.

The method may include injecting fault using transient fault modelling.

In an embodiment, the assigning of a register to the first set of registers or to the second set of registers is performed a fixed number of clock cycles after running the update function, wherein the fixed number of clock cycles is greater than one.

The computer implemented method may be used for detection of faults not needing further checking, wherein fault propagations that happen after the error was detected/diagnosed are considered safe or faults not needing further checking.

In yet another embodiment, a system and method are provided for analyzing faults and displaying a fault propagation path inside a waveform debugger. In the system, a computing device having processor and memory has a fault injection module or application for injecting fault into the circuit design. The computer device further has a fault propagation module or application and/or a fault detection module or application for detecting faults and tracking the propagation of the faults (e.g., signals) through the circuit design. A fault location for injecting a fault and an observation point are identified. At least one observation point is identified. The observation point in the circuit design is a point where errors may have a dangerous impact. The system has a display for displaying a signal path in an ordered list from the fault location to the observation point(s) whereby each signal inside the path has been impacted by the fault. "Impacted" refers to the value in the design between different than what the value would be in a golden design. Only one waveform is shown for a given signal. The impacted signals are shown in a different color (e.g., red) than the non-impacted signals. The signals are displayed in the timing domain, which results in a "stepladder" in a different color showing host the fault moves forward from one signal to the next.

In another embodiment, a system and computer-implemented method are provided for calculation and display of a fault propagation path. The method includes identifying with a computing device a fault location in an electrical circuit; identifying with the computing device an observation point in the electrical circuit; computing with the computing device a fault path from the fault location to the observation point; and displaying in a waveform viewer all signals in the fault path from the fault location to the observation point in order of their creation. The computing of a fault path may include computing the shortest path of impacted signals from the fault location to the observation point. The computing of the shortest fault path may include computing the shortest path in terms of the number of signals, computing the shortest path in terms of the number of instances, or computing the shortest path in terms of the number of registers.

The computing of a fault path may include: (a) entering an observation point in a current signal list; (b) comparing each signal on the current signal list with an impacted signal list; (c) for each compared signal, if the signal is not on the impacted signal list, doing nothing with respect to that signal; (d) for each compared signal, if the signal is on the impacted signal list, checking if the signal is the fault location; (e) for each compared signal on the impacted signal list, if the signal is the fault location skipping to act (h); (f) for each compared signal on the impacted signal list, if the signal is not the fault location adding the fanin signals of the signal to a next current signal list and storing the signal as the parent of the added fanin signals; (g) making the next current signal list the current signal list and returning to act (b); (h) setting the fault locations at the path signal; (i) determining if the path signal has a parent signal; (j) if the path signal has a parent signal, using the parent a new path signal, storing the new path signal in a path list, and returning to act (i) for the new path signal; and (k) if the path signal does not have a parent signal, outputting the path of impacted signals as the shortest fault path to the waveform viewer. The computing of a fault path may further include initializing the next signal list as empty.

The above computer-implemented method for calculation and display of a fault propagation path may include a computer-implemented method for performing a sequential equivalency check for analysis of fault propagation as described above.

The above computer-implemented method for performing a sequential equivalency check for analysis of fault propagation may include a computer-implemented method for calculation and display of a fault propagation path as described above.

Still other aspects, features, and advantages of the present disclosure are readily apparent from the following detailed description, simply by illustrating embodiments and implementations. The present disclosure is also capable of other and different embodiments and its several details may be modified in various obvious respects, all without departing from the spirit and scope of the present disclosure. Accordingly, the drawings and descriptions are to be regarded as illustrative in nature, and not as restrictive. Additional objects and advantages of the disclosure will be set forth in part in the description which follows and in part will be obvious from the description or may be learned by practice of the disclosure.

BRIEF DESCRIPTION OF THE DRAWINGS

For a more complete understanding of the present disclosure and the advantages thereof, reference is now made to the following description and the accompanying drawings, in which.

DETAILED DESCRIPTION

Figure 3:
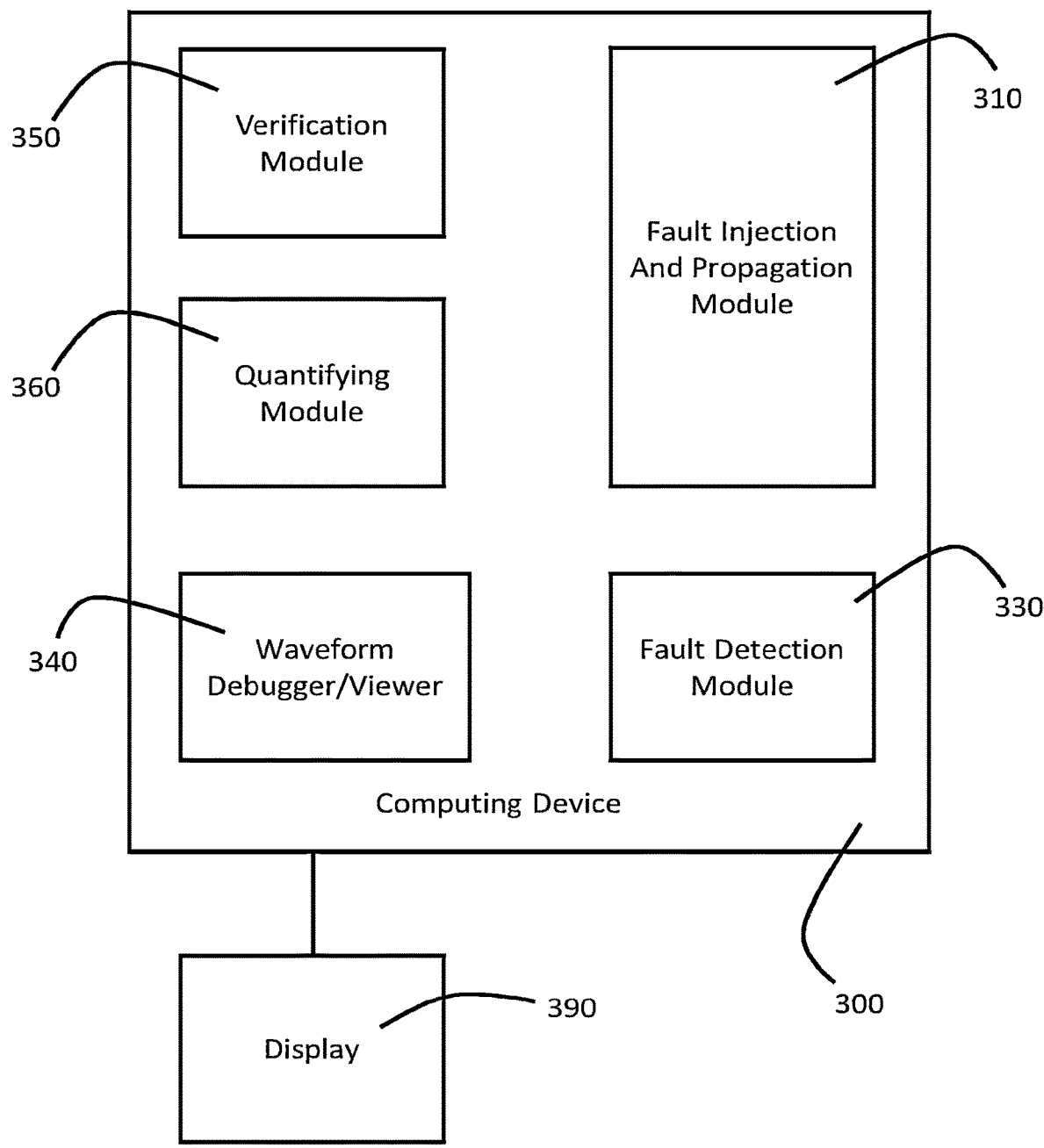
FIG. 3 is a system architecture diagram of a system for analyzing and displaying fault propagation in accordance with an embodiment.

A general architecture for a system and method for analyzing and displaying fault propagation path in accordance with an embodiment is shown in FIG. 3. The system includes a computing device 300, which may be a computer or server having one or more processors, a memory and a non-transitory storage medium such as a hard drive or solid-state drive. The computing device 300 has a fault injection module 310, a fault propagation and detection module 320, and a waveform debugger 340. The computing device may have other modules or applications such as a verification module 350 or a Quantifying module 360. The system further has a display 390. The fault injection module or application 310 provides a simple and flexible interface to define and inject fault scenarios, with no need to change the design, go through complex code-instrumentation acts, or develop a dedicated verification environment.

Fault propagation analysis includes the injection of faults into the gate level models of integrated circuits during verification to prove that faults will be propagated or detected by a safety mechanism. These gate level models may be complex and contain numerous possible fault scenarios. In order to satisfy hardware safety goals, the number of "dangerous non-detected" faults must be minimized.

Fault simulation is a standard approach to determine fault metrics. Faults are stimulated and propagated to observation points, to provide detection by a safety function. Any faults not activated or not propagated by the functional stimulus consume a high proportion of the simulation cycles. They are also difficult to debug when considering stimulus improvements. Thus, these faults may remain in the "non-detected" group, detracting from the desired detection ratio.

A fault scenario may be seen as a set of faulty variants of the original design, the design under test (DUT). The first element of a fault scenario is the set of bit-level design signals where faults shall be injected. The other elements define when and which types of faults shall be injected. The original design corresponds to the particular fault scenario of no faults being present.

Users have the flexibility of defining custom fault scenarios or pick predefined ones. A simple scenario may describe the injection of stuck-at-0 faults on all bits of a number of design signals, all the time. A custom scenario may describe the injection of a Single-Event Upset (SEU) fault, e.g., a bit-flip, in an arbitrary bit of a memory location, occurring only once and coinciding with some other condition, for example, a memory read on a specific address. User assertions may be associated with specific fault scenarios, and powerful proof strategies are automatically setup to handle the simultaneous exhaustive verification of huge fault populations in large and complex designs. Moreover, dedicated debug features speed up the daunting task of examining assertion failures on fault-injected designs, where things may get quite confusing. Finally, the quantify module may measure the coverage of the overall set of assertions at the push of a button and expose both mission and safety-related functional areas that have verification gaps.

Faults may be classified as propagatable and non-propagatable. Non-propagatable faults may never lead to a malfunction of the system regardless of its state. Hence, they are safe and may be removed from the dangerous fault list, improving the fault metric. This is where formal technology such as equivalence checking may be effectively applied in an automated way using the Fault Propagation and Detection Module 320. The Fault Propagation and Detection Module 320 automatically identifies non-propagatable faults, allowing their safe elimination prior to simulation, thereby cutting on simulation and debug time while increasing the nominal fault coverage. Any know method for identifying non-propagatable faults may be used.

The Fault Propagation Module 320 is applied to the overall fault population both prior to and after fault simulation. The Fault Propagation Module 320 has a "fast mode" and a "deep mode." Operating in a "fast mode" the Fault Propagation Module 320 is run pre-simulation, utilizing formal analysis to efficiently identify non-propagatable faults, thereby enabling the desired fault detection ratio to be rapidly achieved while avoiding unnecessary effort. These faults may be pruned from the fault list without the requirement for fault simulation test vectors. The entire fault-simulation process is significantly accelerated through the removal of this class of faults from those that need to be run in fault simulation.

Operating in a "deep mode," the Fault Propagation Module 320 may be used to analyze non-propagatable faults identified during a simulation-based fault injection process to either improve the safety mechanism or to classify them as safe. This automated act greatly reduces the manual effort required post-fault simulation to identify any remaining dangerous faults. The analysis is accomplished without modification of the netlist—a requirement of the certification standards.

The only required input is a gate or RTL model for the circuit under test.

The system identifies fault locations where it already performs optimizations such as net collapsing to avoid duplications. Alternatively, a fault list or design areas of interest indication may be provided, which is used by the tool to refine the fault list.

Furthermore, an initial design state may be loaded to allow a context analysis. Such an analysis may be important to understand how faults behave when injected at a certain execution time.

After fault list creation, the system performs a fully automated formal analysis to identify non-propagatable faults. After the analysis, the non-propagatable, as well as the potentially propagatable faults, may be written into a simple Comma-Separated Values (CSV) formatted text file for further processing. In addition, an analysis summary report is generated. A fast statistical analysis may also be performed where the fault list is sampled rather than analyzing all faults.

Figure 1:
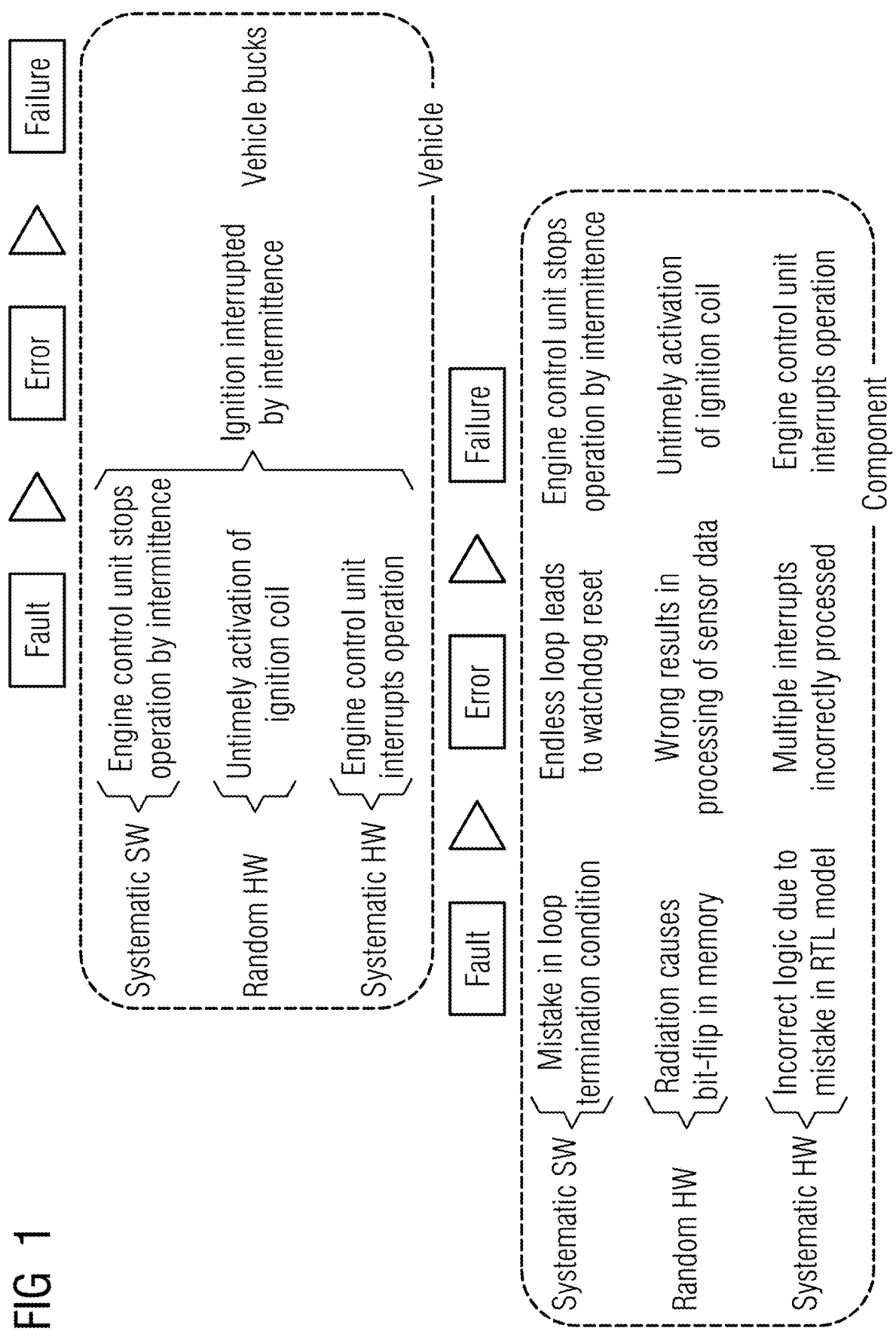
FIG. 1 is a diagram illustrating various types of faults that may occur in a safety critical system and exemplary results of such faults.
Figure 2A:
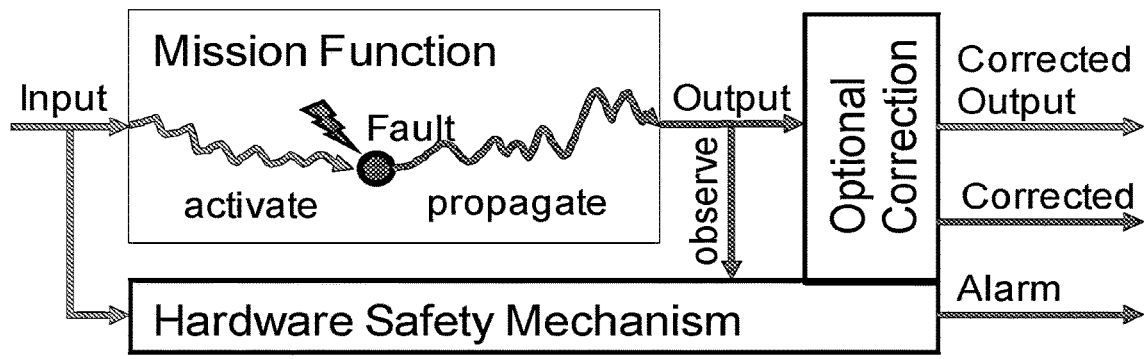
FIG. 2A is a diagram illustrating an example of a safety critical system having a hardware safety mechanism.
Figure 2B:
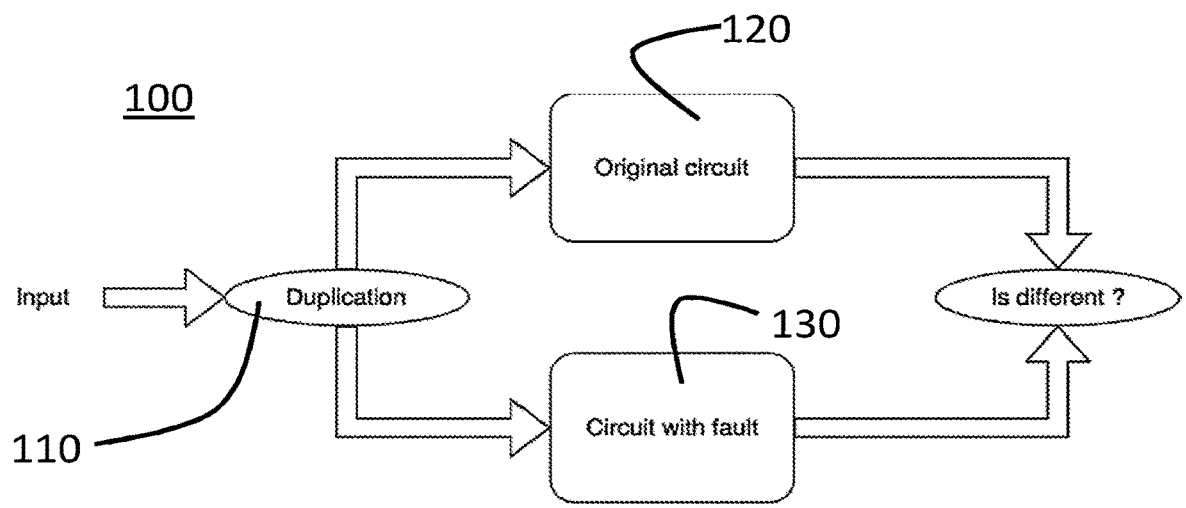
FIG. 2B is flow diagram of a conventional (prior art) circuit for performing a sequential equivalence check.
Figure 2C:
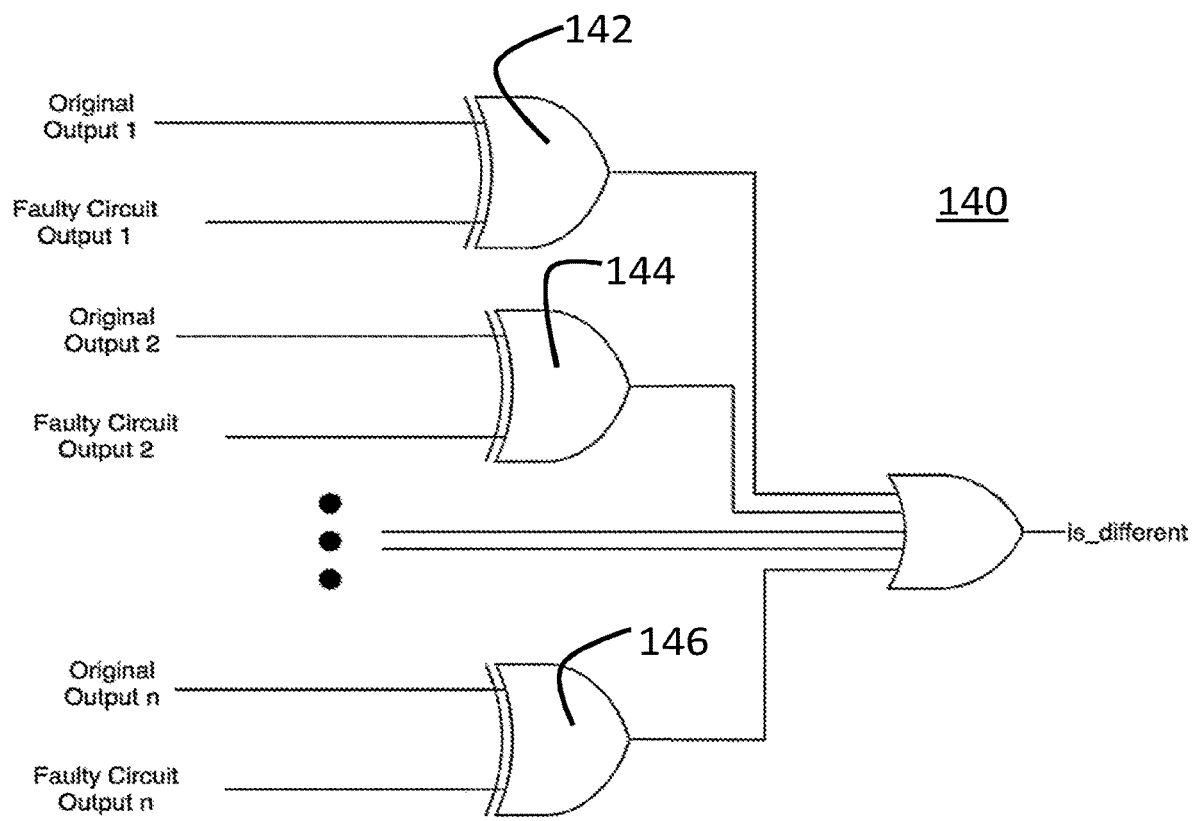
FIG. 2C is a schematic diagram of a conventional (prior art) comparator circuit for comparing outputs in a sequential equivalency check.

The present disclosure incorporates compact encoding for the equivalence problem. The classical equivalence checking procedure requires duplication of the circuit logic as shown in FIG. 2B. The combinatorial logic duplication may be reduced, if this logic depends on primary inputs that are shared between designs. The state-full elements (e.g., flip-flops, memories, etc., herein referred to as 'registers' for simplicity) need to be duplicated as well as combinatorial logic which depends on these registers.

In the present disclosure, using compact encoding, registers need to be duplicated only if the faults may propagate into them. If it is known that the value in a register is not affected by a fault injection, then this register may be shared between the original and faulty design, as they have the same value anyway. In this way, the present disclosure reduces duplication of combinatorial logic in the fan-out of such a state.

Some simple methods for identifying the unaffected states are known. The main idea in those is that a fault cannot propagate to a register which is not in its cone of influence. This structural argument has the merit of being easy to implement, however, many times the fault does not propagate to registers which are in its cone of influence, for instance because of constrains (external or coming from the design itself). The present disclosure provides a method and system to find the set of registers that are not affected by the fault using a formal check.

Figure 4:
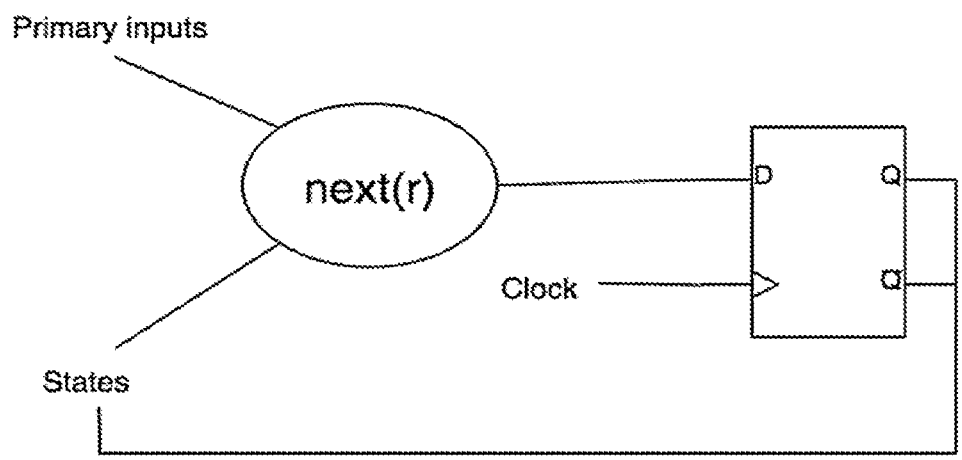
FIG. 4 is a diagram of a next state function in accordance with an embodiment.

First, as shown in FIG. 4, every register r has a next state function next (r), which is given by the combinatorial logic feeding its input. The variables in these functions are either primary inputs or other registers. We may check whether the next state may be different in the presence of a fault in the same way as in FIG. 2B (inputs=primary inputs+states). However, as we consider the states to be variables in the next state function, this check may be realized as a combinatorial check with one call to the sat solver. If such a check is successful, we may be sure that the fault is not propagated into this register. On the other hand, if the check is not successful, it may happen that the particular state of the other registers under which the propagation happens is not reachable due to sequential properties of the design.

Therefore, if we are not successful with the combinatorial check, we may proceed with a sequential check that takes into account reachability. However, such check may be demanding, sometimes as demanding as the fault propagation check itself. Still, it is a useful heuristic to try to run the sequential check on low effort (short timeout), as it may solve some cases fast.

Figure 5:
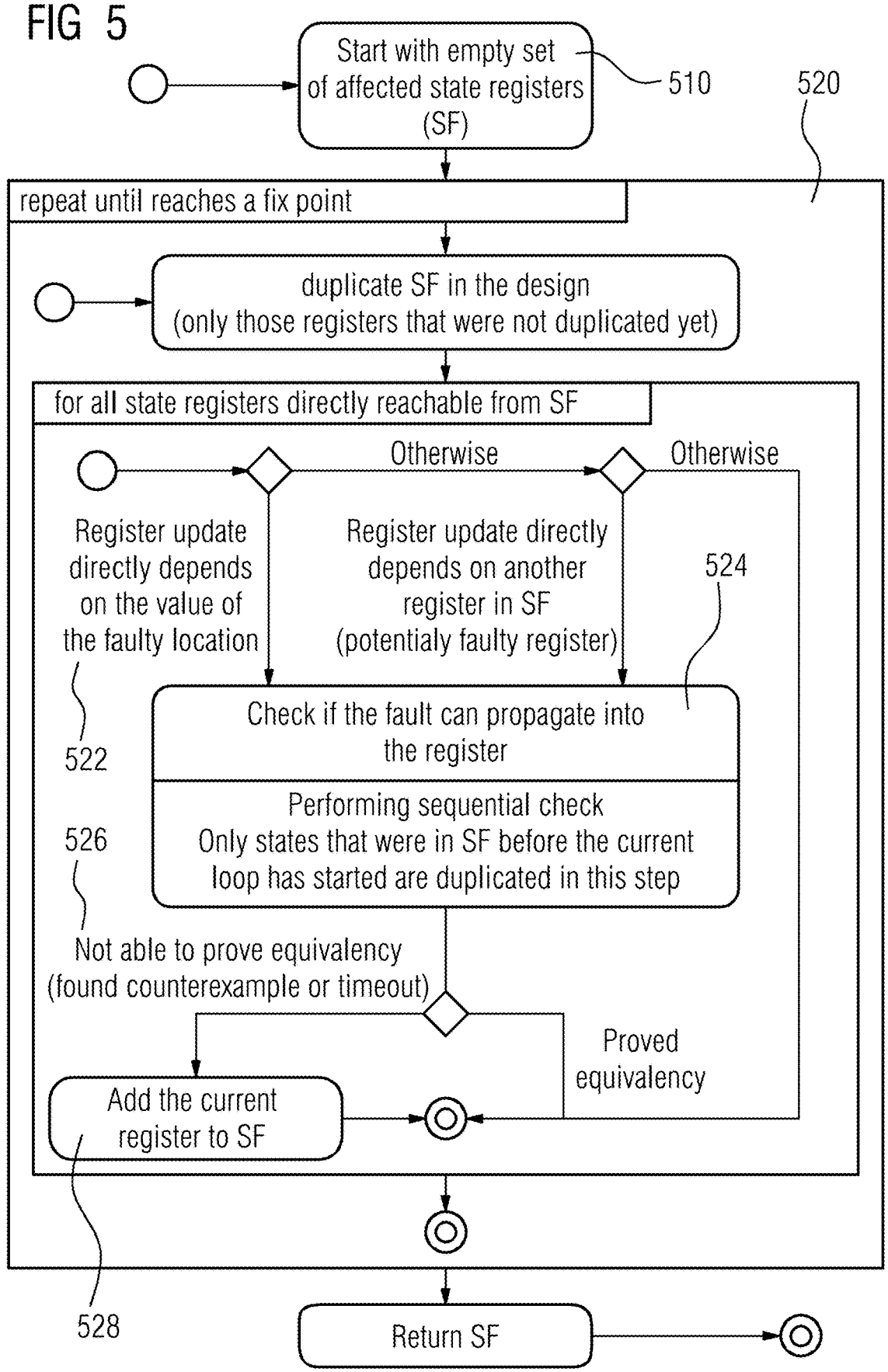
FIG. 5 is a flow chart of a method for iterative state mapping in accordance with an embodiment.

To minimize the state duplication and to simplify the problem, the present disclosure uses the method shown in FIG. 5 that iteratively builds the set of states into which the fault propagates. It is based on inductive reasoning. A set of states $S_{faualty}$, into which the fault may potentially propagate is built inductively based on the assumption that it cannot propagate to the other states (this allows state space reduction). When a fixpoint is reached, the fault is proven to never propagate into registers that are not present in $S_{faulty}$. Therefore, only registers that are present in $S_{faualty}$ need to be duplicated.

At initialization, there is a set of registers S of which there is an empty set of affected state registers $S_{faulty}$ (510). For each register that is directly reachable from the fault location, run a combinatorial or sequential equivalency check for its update function next (r) (520). If the register update directly depends on the value of the faulty location (522), then check if the fault may propagate into the register (524). If the fault may propagate into the registers (526), e.g., it is not able to prove equivalency (found counterexample or timeout), then add that register to the set of $S_{faulty}$ (528). Once all registers directly reachable from the fault location are tested, the system checks whether any new states were added to $S_{faulty}$. If no new states were added, $S_{faulty}$ has reached a fixed point and the method is complete. If new states were added to $S_{faulty}$, then act 520 is repeated for all registers r from S that are not yet in $S_{faulty}$, and which are directly reachable from a state in $S_{faulty}$ or from the fault location.

Figure 6:
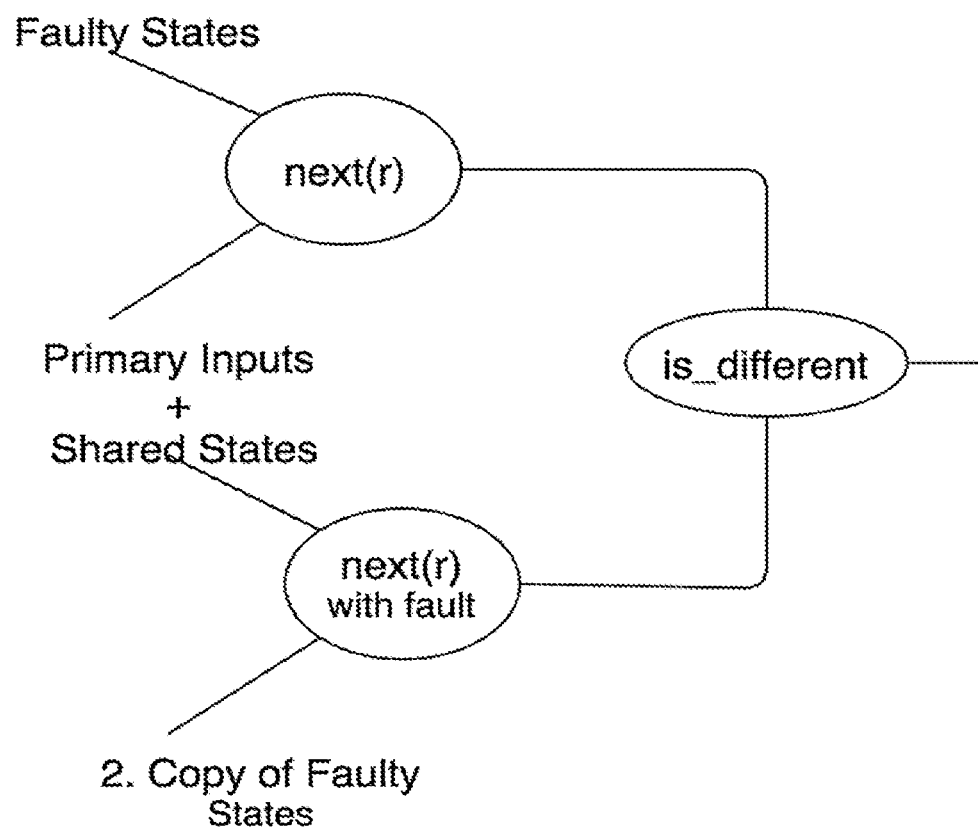
FIG. 6 is a flow diagram of a circuit for performing a sequential equivalency check in accordance with an embodiment.

After the method is finished, $S_{faulty}$ contains the registers that may at some point have a different value in the original and faulty design. The rest of the states may be shared in the sequential check in analogically as shown in FIG. 6. We say that such states that need not be duplicated are mapped.

Apart of reducing the state space of the final formal PA/PA check, identifying shared states may prove non-propagation for some observation points directly, provided that an observation point is connected to the fault location only through shared states. This may be improved further by removing the shared states from the cones of influence of the fault (as we have proven that even though they are structurally connected, there is in fact no influence).

Figure 7:
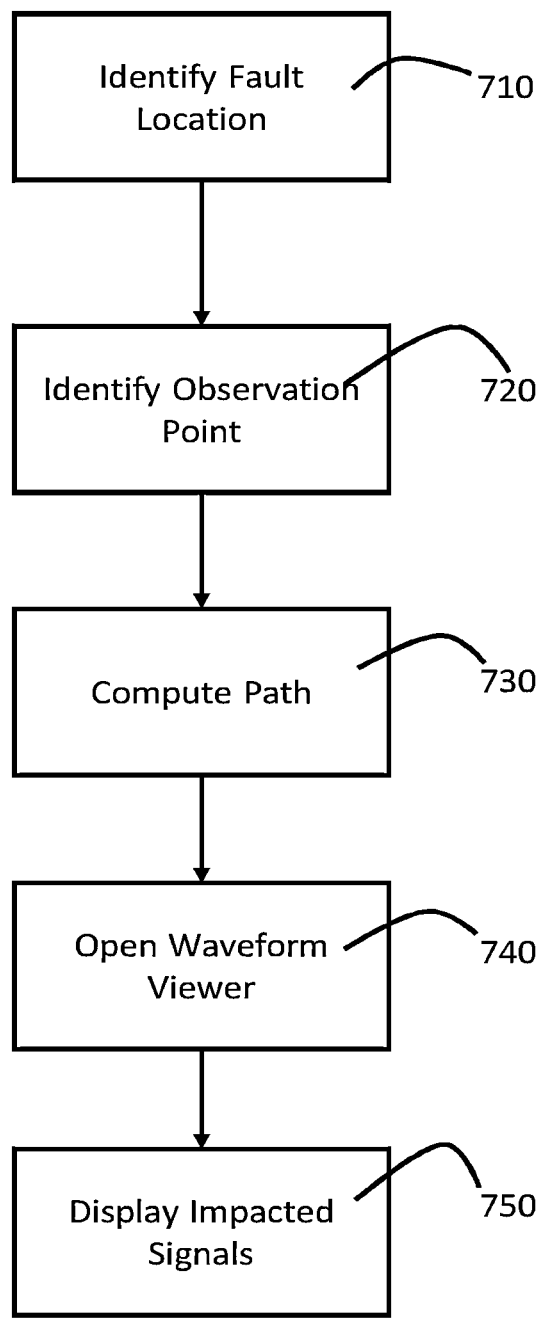
FIG. 7 is a flow chart of a method for analyzing and displaying fault propagation in accordance with an embodiment.

In the method of an embodiment, as shown in FIG. 7, the system identifies 710 a fault location for injecting a fault and identifies 720 an observation point. The observation point in the circuit design is a point where errors may have a dangerous impact. The system computes 730 the fault path (explained later in further details with reference to FIGS. 7 and 8). The system then opens 740 a viewer in the waveform debugger 340. The system 300 then displays 450 on the display 390 an ordered list from the fault location to the observation point whereby each signal inside the past has been impacted by the fault. "Impacted" refers to the value in the design between different than what the value would be in a golden design. In alternative embodiments, a plurality of observation points may be used, for example, if the fault propagates to more than one observation point.

Figure 8:
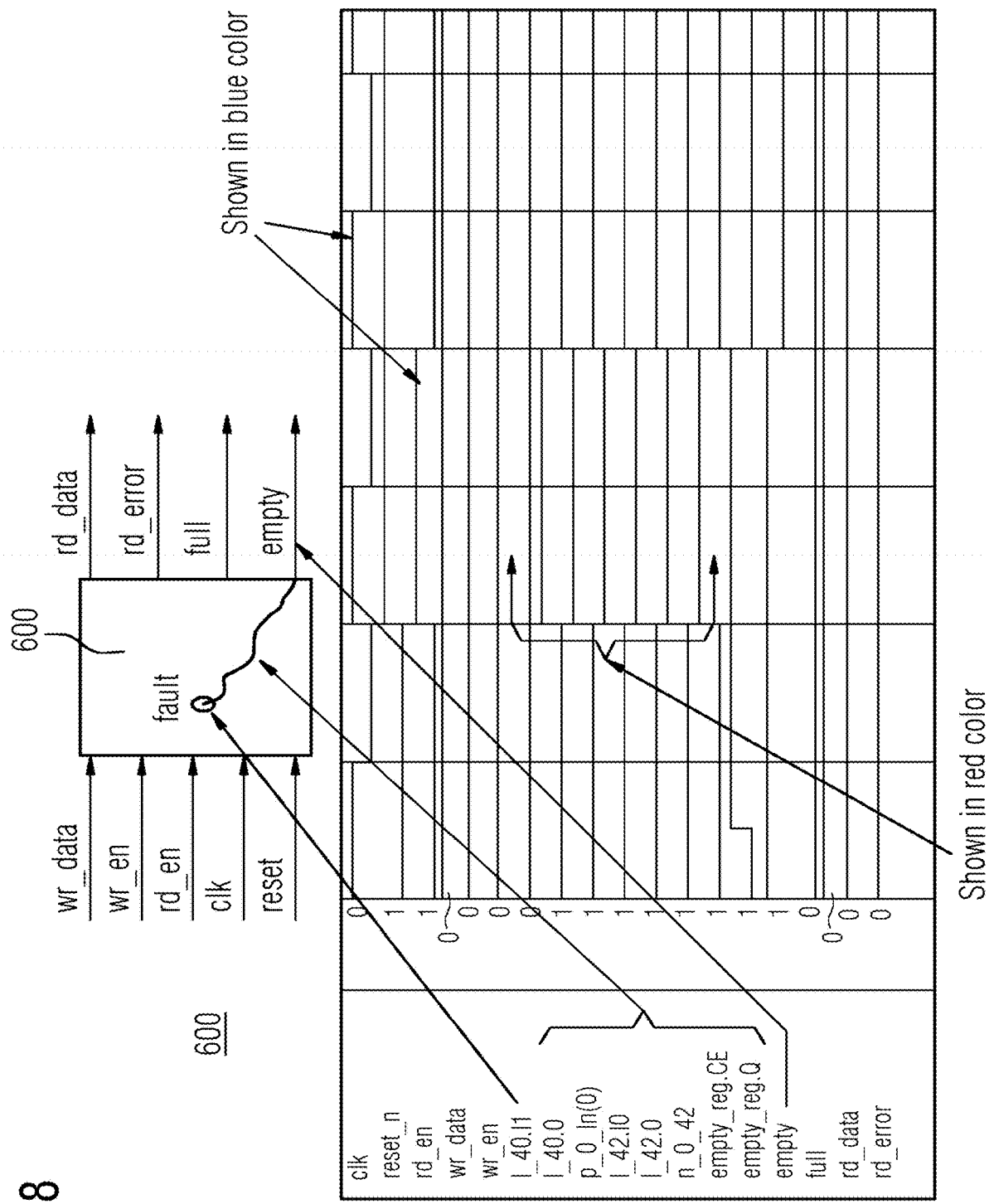
FIG. 8 is an illustration of a display of a system for analyzing and displaying fault propagation in accordance with an embodiment.

As shown in FIG. 8, only one waveform is shown for a given signal. The impacted signals are shown in a different color (e.g., red) than the non-impacted signals. Indicators other than color, such as line thickness or the type of line (e.g., dashed, dotted, etc.) or any other visual indicator, may be used. The signals may be shown in a different color only when the value of the golden and faulty signal is different. Also, as an alternative to the display shown in FIG. 8, the values of the golden and fault signals may be placed next to each other onto a given single wave. Displaying two values may be particular useful when the displayed signal is not a single bit. The signals are displayed in the timing domain, which results in a "stepladder" in a different color showing host the fault moves forward from one signal to the next. Different colors may be used in the display to show how the fault moves forward from one signal to the next. As also shown in FIG. 8, it may be beneficial to display the inputs of the device before the signal and the outputs of the device after the signal. In the alternate embodiment having multiple observation points, data, and graphs for a plurality of observation points may be shown on the display or waveform viewer.

Figure 9:
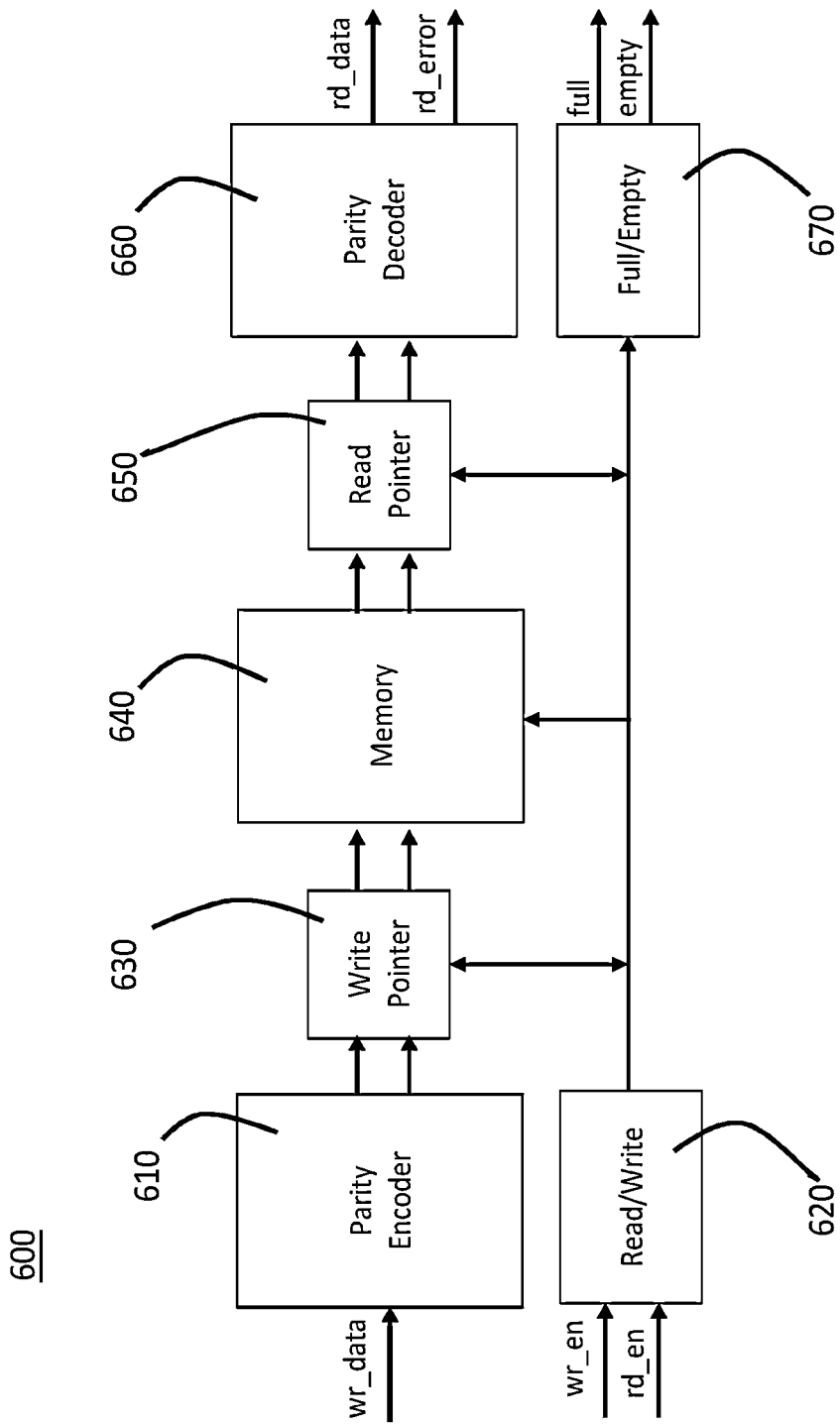
FIG. 9 is a flow diagram illustrating signal flow through a system for analyzing and displaying fault propagation in accordance with an embodiment.

An exemplary architecture 600 for verification of hardware safety mechanisms is shown in FIG. 9. The system has a parity encoder 610, read/write 620, write pointer 630, memory 640, read pointer 650, parity coder 660, and full/empty 670.

As shown in FIG. 9, the inputs for the fault path calculation 800 are start point (fault location) and end point (observation point), a list of signals that were impacted by the fault as calculated from a counterexample (the complete list of impacted signals), and the fanin/fanout relation of each single signal in the design. The output of the fault path calculation is the shortest path from the start point to the end point. The shortest path may be in terms of the number of signals, the number of instances or a number of registers/states. Instances may have different numbers of signals attached to them. An instance may be a cell (like an AND call or FlipFlop cell). The shortest path from the start point to the end point may not be the absolute shortest path but may include any deviations or alterations between the start point and the end point. Deviations or alterations may be added by any means such as FlipFlop and the like.

Figure 10:
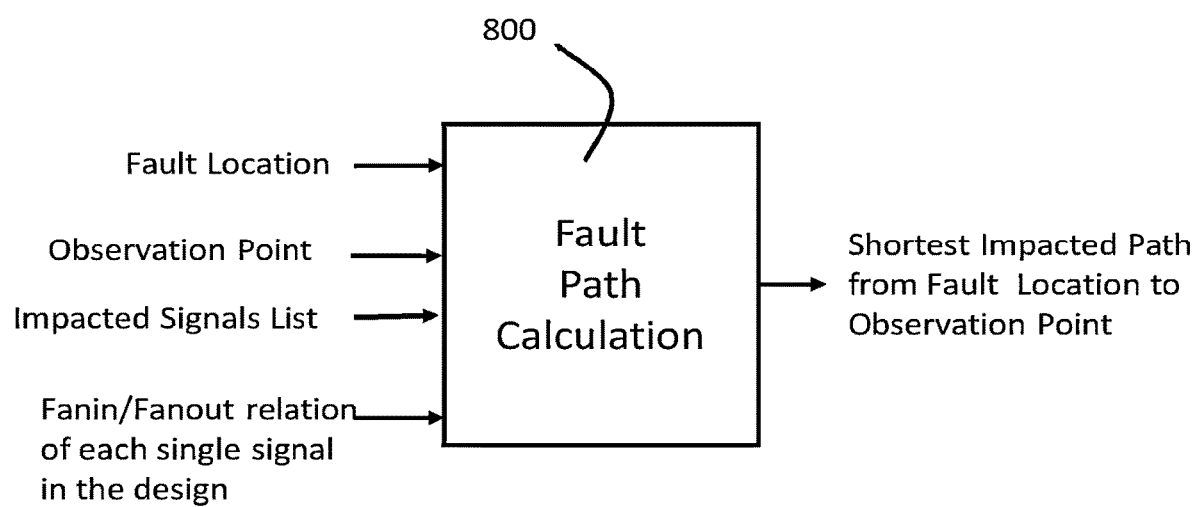
FIG. 10 is a diagram illustrating a fault path calculation in accordance with an embodiment.
Figure 11:
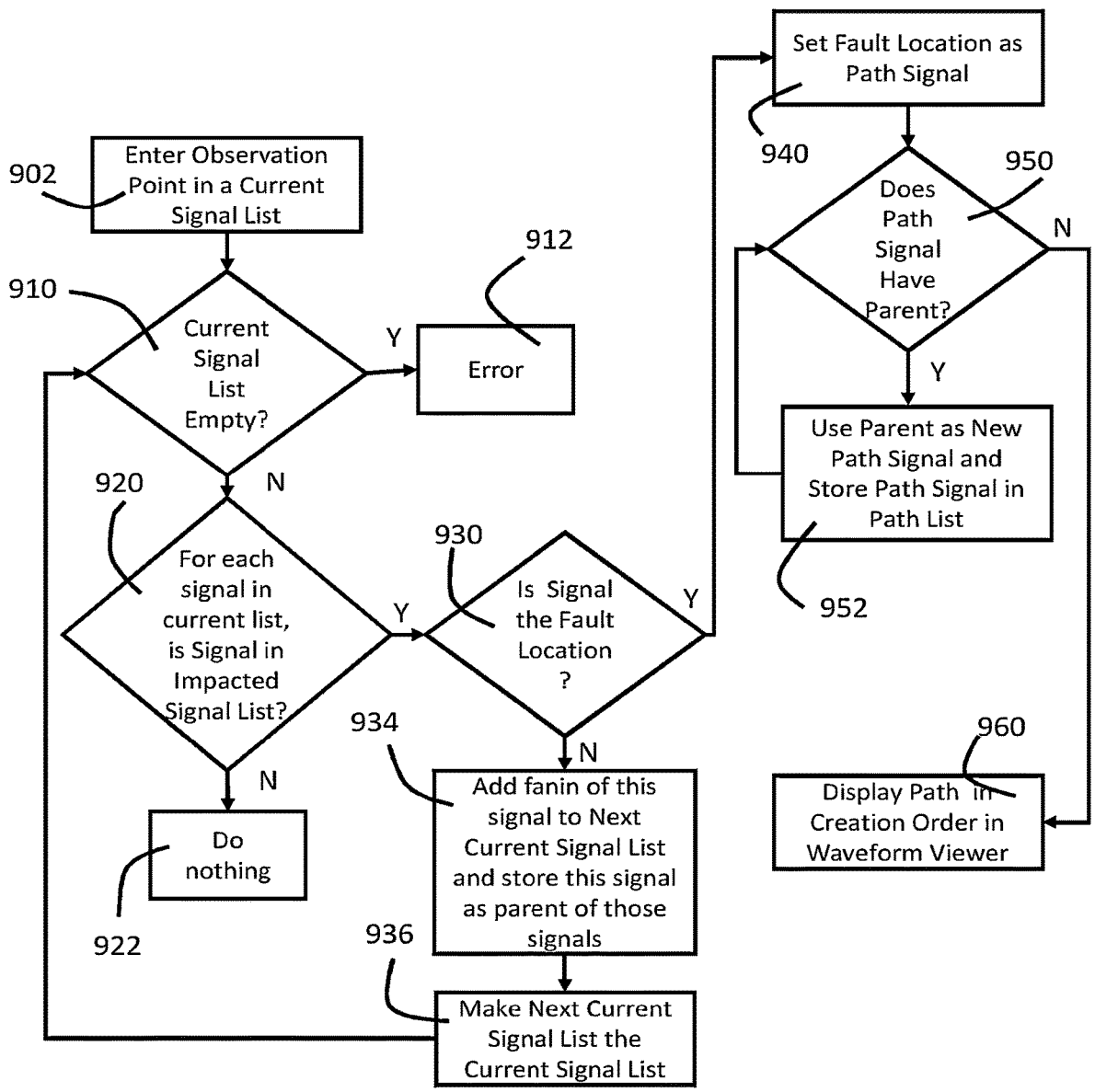
FIG. 11 is a flow diagram of a method for computing a fault path in accordance with an embodiment.

An exemplary method for computing a fault path in accordance with an embodiment is described with reference to FIG. 10. The inputs for the calculation are shown in FIG. 8. An Observation Point is entered into a Current Signal List at 902. If this is the first iteration, the Current Signal List may have only one signal (the Observation Point). If it is a later iteration, the Current Signal List will have a plurality of signals. At 910, if the Current Signal List is empty, the system knows there is an error and appropriate error notification is undertaken at act 912. If the Current Signal List is not empty at 910, the system determines at 920 for each signal in the Current Signal List whether that signal is on the Impacted Signal List. If a particular signal is not on the Impacted Signal List, the system does nothing at 922 with respect to that signal. If a particular signal is on the Impacted Signal List, the system checks at 930 whether the signal is the Fault Location. If it is not the Fault Location, the system adds the fanin of this signal to a Next Current Signal List and stores the signal as the parent of those fanin signals at 934. Once all signals on the Current Signal List have been checked, the system makes the Next Current Signal List the Current Signal List at 936 and then returns to 910. If a signal is the fault location at act 930, the system sets the fault location as the path signal at 940. The system than determines at 950 whether the path signal has a parent. If yes, the system sees that parent as a new Path Signal and stores that Path Signal in the Path List at 952. The system then returns to act 950. If the Path Signal does not have a parent, the system displays the path in creation order in a waveform viewer at 960. In this way, the shortest path from the fault location to the observation point is determined and displayed.

Encoding Fault Detection/Diagnosis

In many cases, hardware components contain internal diagnostic or detection mechanism that checks for potential erroneous behavior. If such a behavior is observed, an error is communicated outside, using special outputs (error flags). The user (e.g., software or other connected hardware) is responsible for recovering from the error. Errors that are detected by the internal detection mechanism and announced to the user are considered safe errors. Alternatively, ISO 26262 part 5 also classifies such errors as multipoint detected failures. An error that is not detected by the internal detection mechanism is a dangerous failure and ISO 26262 part 5 classifies such dangerous failures as residual.

Hence, we want to provide that the formal tool does not consider behavior where the injected fault is detected by the internal detection mechanism. We may achieve this by setting the output of FIG. 7 to 0 if the internal detection mechanism reports an error. However, this requires the error flag to be raised by the internal detection mechanism in exactly the same clock cycle in which the fault is propagated.

A more powerful approach requires the error flag to keep the high logical value once it was set. This provide that all the fault propagations that happen after the error was detected/diagnosed are considered safe.

The most complex situation arises if the error may be recognized by the internal detection mechanism only a certain number of clock cycles after a fault has propagated to the observation points. In case there is a given fixed number of clock cycles in which the error flag is raised, we may postpone the 'is different' signal from FIG. 6 accordingly using a corresponding number of registers connected in a series, making sure that a difference will be found by formal tool only after the specified number of clock cycles, giving enough time to the internal mechanism to signal the presence of an error.

The presence of a fixed limit is not a limitation, as the user needs to have a way to decide whether an error occurred in finite time and if no limit was imposed it would require the user to wait indefinitely.

Transient Fault Modelling

A basic fault modeling consists of introducing a constant value in place of a given signal in the circuit. This means the faulty signal will have the same value in simulation or formal check. This model is called stuck-at-0 or stuck-at-1 based on the value of the injected constant or in general it may be called stuck-at-value.

Even though this model may be used successfully for some types of faults, sometimes we may be interested in transient faults, as when for instance a circuit element is hit by a high-energetic particle, leading to a temporary change of its logical value for one or multiple clock cycles.

Transient faults may be easy to model in simulation, where the faulty values may be inserted randomly, however in formal setting we need to adjust our model to express the upfront unknown time and limited duration of this type of random errors.

A simple example of a transient fault is a single upset. This means a signal value is affected by a fault only for one clock cycle, however we don't know upfront when it is going to occur. This uncertainty is modelled as non-determinism introduced by a new input. A high value on the new input forces the fault to occur provided it has not occurred so far. The single-upset fault injection may be modelled by added sequential logic as in FIG. 12. This enables a formal tool to consider only such execution paths that contain faulty value for exactly one time cycle without enforcing a concrete clock cycle during which the fault is injected.

Figure 12:
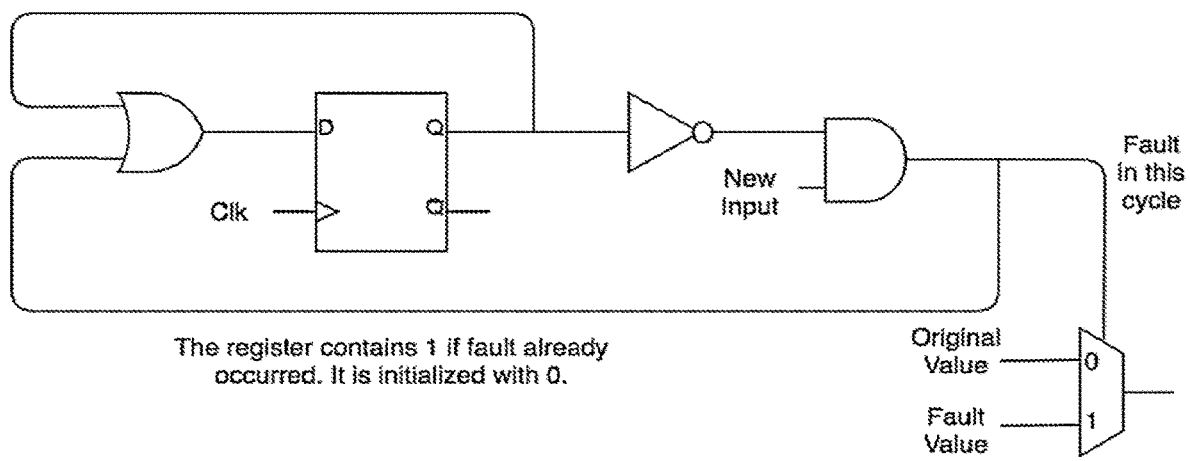
FIG. 12 is a diagram of a controller for a single-upset fault injection in accordance with an embodiment.

The circuit from FIG. 12 is an implementation of a finite automaton equivalent to the regular expression "n*fn*", where "n" is non-faulty state and f is faulty state. This regular expression says that unspecified number of non-faulty states is followed by exactly one faulty state and then again unspecified number of non-faulty states. In a similar manner, we may describe even very complex fault patterns.

The process of turning regular expressions into automata and automata into circuits is well established.

We may support in this way any fault patterns that are describable by a regular expression.

The method reduces the size of equivalence checking problem that arises when proving fault non-propagation in sequential circuits. This approach leads to higher state space reduction than prior systems and methods.

The method further diagnoses safety of fault propagation by encoding it as a formal property.

Still further, the method encodes one-time-upset and more general upset schemas within the formal problem that is presented to the sequential equivalence checker. We support any upset patterns that may be expressed by a regular expression or a similar formalism.

The foregoing description of the embodiments have been presented for purposes of illustration and description. It is not intended to be exhaustive or to limit the disclosure to the precise form disclosed, and modifications and variations are possible in light of the above teachings or may be acquired from practice of the disclosure. The embodiments were chosen and described in order to explain the principles of the disclosure and its practical application to enable one skilled in the art to utilize the disclosure in various embodiments as are suited to the particular use contemplated. It is intended that the scope of the disclosure be defined by the claims appended hereto, and their equivalents. The entirety of each of the aforementioned documents is incorporated by reference herein.

The invention claimed is:

1. A computer-implemented method for calculation and display of a fault propagation path, the method comprising:
identifying, by a computing device, a fault location of a fault in an electrical circuit;
identifying, by the computing device, an observation point in the electrical circuit in which the fault has propagated from the fault location to the observation point;
computing, by the computing device, a fault path from the fault location to the observation point; and
displaying, in a waveform viewer, all impacted signals in the fault path in an ordered list from the fault location to the observation point in order of their creation.

2. The computer-implemented method of claim 1, wherein the computing of the fault path comprises computing a shortest path of the impacted signals from the fault location to the observation point.

3. The computer-implemented method of claim 2, wherein the computing of the shortest path comprises computing the shortest path in terms of a number of signals.

4. The computer-implemented method of claim 2, wherein the computing of the shortest path comprises computing the shortest path in terms of a number of instances.

5. The computer-implemented method of claim 2, wherein the computing of the shortest path comprises computing the shortest path in terms of a number of registers.

6. The computer-implemented method of claim 2, wherein the computing of the shortest path comprises adding a deviation or alteration to the shortest path.

7. The computer-implemented method of claim 1, wherein the displaying comprises displaying the impacted signals in a timing domain, resulting in a stepladder in a different color in the display to show how a fault moves forward from one signal to a next signal.

8. The computer-implemented method of claim 1, wherein the displaying comprises using a visual indicator.

9. The computer-implemented method of claim 8, wherein the visual indicator comprises at least one different color, at least one different line thickness, at least one different type of line, or a combination thereof.

10. The computer-implemented method of claim 1, wherein the identifying of the observation point comprises identifying a plurality of observation points in the electrical circuit, wherein the computing of the fault path comprises computing a plurality of fault paths from the fault location to the plurality of observation points, and wherein the displaying of the impacted signals comprises displaying, for each fault path of the plurality of fault paths, all impacted signals in the fault path from the fault location to the observation point in order of creation, wherein data and graphs for the plurality of observation points are displayed.

11. The computer-implemented method of claim 1, wherein the computing of the fault path comprises:

(a) entering the observation point in a current signal list;

(b) comparing each signal on the current signal list with an impacted signal list;

(c) for each compared signal on the impacted signal list that is not the fault location, adding fanin signals of the respective signal to a next current signal list and storing the respective signal as a parent of the fanin signals;

(d) making the next current signal list the current signal list and returning to act (b);

(e) setting fault locations at a path signal;

(f) determining if the path signal has a parent signal;

(g) when the path signal has a parent signal, using the parent signal as a new path signal, storing the new path signal in a path list, and returning to act (f) for the new path signal; and (h) when the path signal does not have a parent signal, outputting the fault path of the impacted signals as a shortest fault path to the waveform viewer.

12. The computer-implemented method of claim 1, wherein the impacted signals have signal values that are different from signal values present in a golden design.

* * * * *